United States Patent
Waters

(10) Patent No.: US 6,362,516 B1
(45) Date of Patent: Mar. 26, 2002

(54) ELECTRONIC APPARATUS

(75) Inventor: Ronald S. Waters, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/832,249

(22) Filed: Apr. 3, 1997

(51) Int. Cl.[7] .......................... H01L 23/02; H01L 23/34
(52) U.S. Cl. ...................... 257/678; 257/723; 257/706; 257/722; 361/709; 174/163
(58) Field of Search .................. 257/723, 726, 257/727; 361/704, 707, 709, 710, 715, 719, 720, 809, 818, 820; 439/66, 69, 73, 330, 331; 174/16.3, 17 R; 165/80.2, 80.3, 185; 438/106, 121

(56) References Cited

U.S. PATENT DOCUMENTS

| | | | |
|---|---|---|---|
| 5,216,278 A | | 6/1993 | Lin et al. ..................... 257/688 |
| 5,311,402 A | * | 5/1994 | Kobayashi et al. .......... 361/707 |
| 5,384,940 A | * | 1/1995 | Soule et al. ................. 361/809 |
| 5,400,220 A | | 3/1995 | Swamy ........................ 361/760 |
| 5,518,410 A | | 5/1996 | Masami ........................ 439/71 |
| 5,662,163 A | * | 9/1997 | Mira ........................... 361/704 |
| 5,677,829 A | * | 10/1997 | Clemens ..................... 361/697 |
| 5,703,753 A | * | 12/1997 | Mok ........................... 361/707 |
| 6,049,215 A | * | 4/2000 | Agahdel et al. ............ 324/758 |
| 6,137,296 A | * | 10/2000 | Yoon et al. ................. 324/754 |
| 6,191,480 B1 | * | 2/2001 | Kastberg et al. ........... 257/727 |

* cited by examiner

Primary Examiner—Jhihan B Clark
(74) Attorney, Agent, or Firm—Patricia S Goddard; Richard A. Rodriguez

(57) ABSTRACT

A semiconductor device (40, 50, 70) is electrically connected to a circuit board (30) through use of one or more connectors (10, 20, 90). Connector (10) includes locking pins (14) which fit through alignment holes (34) of the circuit board and which are either mechanically deformed to lock the pins in the holes, or which are received by locking holes (24, 94) of a complementary connector (20, 90). An interposer (60, 80) is used as a compliant member to assure that adequate electrical connection is made between the external terminals (42, 72) of the semiconductor device without damaging the device or the circuit board. Connector (10) includes a cavity (12) which is dimensioned to accommodate the semiconductor device while assuring proper alignment between the locking pins, the external terminals, and the circuit board. Use of the connector enables electrical connection of the device to the circuit board without requiring physical metallurgical bonds between the semiconductor device terminals and the pads on the circuit board.

20 Claims, 3 Drawing Sheets

ELECTRONIC APPARATUS

FIELD OF THE INVENTION

The present invention relates generally to an electronic apparatus, and more particularly to methods for providing physical connection of semiconductor devices to circuit boards without using a surface mounting process.

BACKGROUND OF THE INVENTION

Circuit board manufacturers/assemblers have to physically attach a variety of semiconductor devices to their board to produce their end product. A common method for attaching semiconductor devices to the circuit boards is to place the semiconductor devices in the appropriate positions on the board, and to subject the board to a high temperature reflow operation. In the reflow operation, a connection medium, such as solder, is used to mechanically and electrically bond the external terminals of the semiconductor device to the appropriate landing pads on the circuit board.

Often times, a circuit board assembler does not use the same semiconductor components on all boards that are being assembled. For example, a manufacturer who is assembling boards for use in a computer may want to attach varying numbers of semiconductor memory devices, such as fast static random access memory (SRAM) devices. Rather than subjecting one set of boards to a reflow operation having the SRAM devices and subjecting another set of boards to a reflow operation without fast static rams, it is desirable for a larger set of identical boards to be subjected to the reflow operation, with optional components, such as additional memory, being added to the board just prior to shipment to the customer. Such a system would simplify the assembly process. Moreover, it would be attractive if the optional devices could be attached to the circuit board without an additional reflow operation. In particular, it would be desirable if the optional devices to be attached to the board could be connected without forming a thermally-induced metallurgical connector between external terminals of the device and the conductive pads on the circuit board. The process of forming the metallurgical bonds (i.e. the reflow or surface mount process) is time consuming, adds excessive manufacturing costs, and precludes easy removal or replacement of the optional devices so attached.

While a variety of non-metallurgical mechanical connections have been proposed in the prior art, known mechanical connections have several disadvantages. For example, it is known to use a rigid plate in combination with bolts and nuts to hold a semiconductor device against a printed circuit board. However, a disadvantage of this process is the number of piece parts which are required in the assembly of such circuit boards, and the difficulty in getting a uniform force across the plate due to variations in torque between the various nuts. Another method of providing mechanical connection of a semiconductor device to a circuit board is through the use of a hinged socket. The socket is connected to the circuit board, and the semiconductor device is placed in between the two hinged members of the socket. The socket is then closed and an electrical connection is made between the semiconductor device and the circuit board through spring-loaded conductive members. A disadvantage with the use of a socket, however, is that the sockets are expensive, primarily due to the need for spring-load conductive members, and undesirably increase the profile or height of the final circuit board assembly.

Accordingly, a need exists for an improved method for electrically connecting a semiconductor device to a circuit board after the board has undergone a traditional reflow operation. More particularly, a need exists for providing electrical connection between a device and a circuit board without forming thermally-induced metallurgical connections between the device and the circuit board. Moreover, it would be desirable for such a method to be inexpensive in material costs, to provide minimal height to the final circuit board apparatus, and to be easy to manufacture and assemble with a minimal number of piece parts.

DETAILED DESCRIPTION OF A PREFERRED EMBODIMENT

Figure 1:
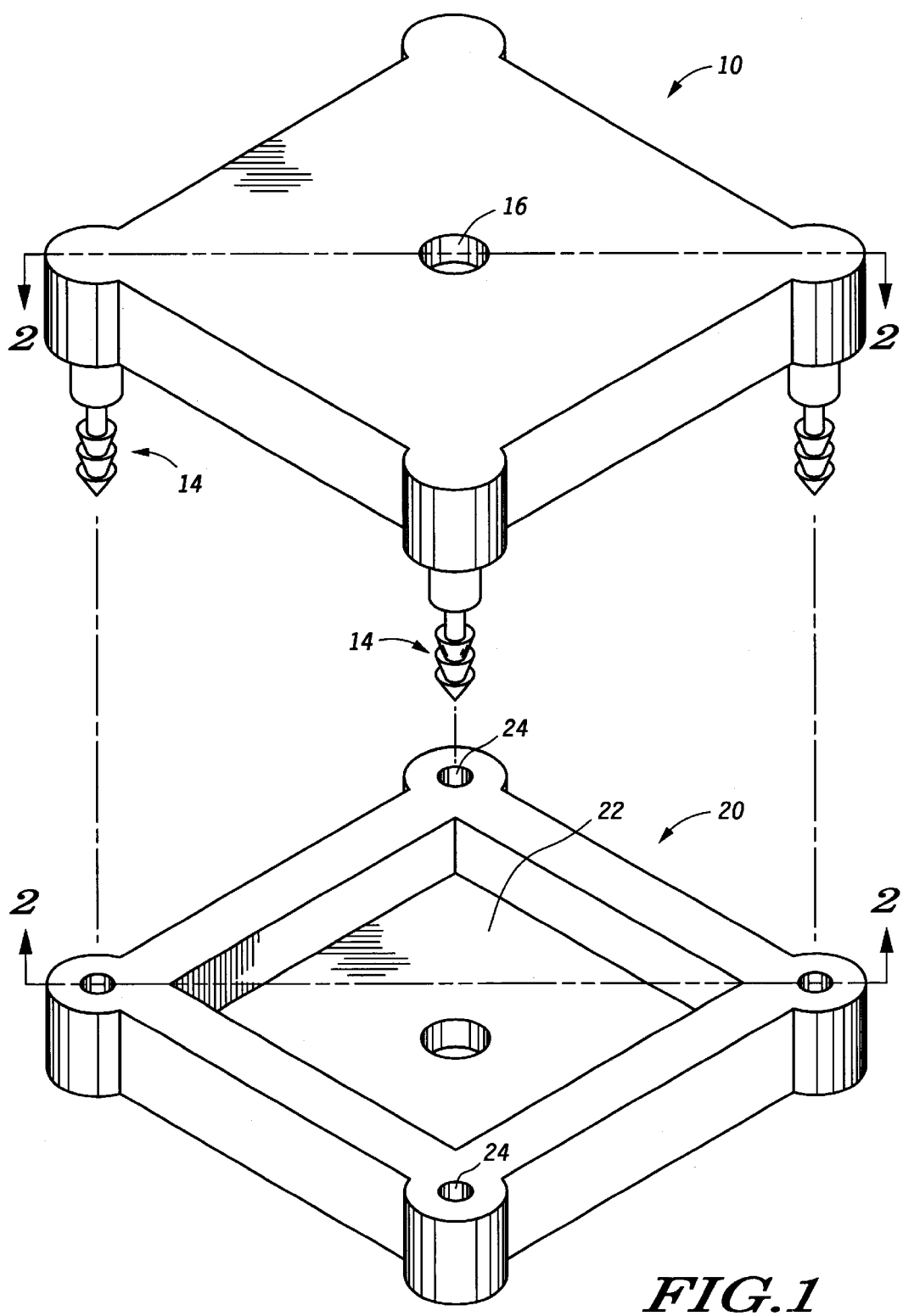
FIG. 1 is a perspective view of an upper and lower connector for connecting semiconductor devices to a circuit board in accordance with one embodiment of the present invention.

Generally, the present invention relates to an electronic apparatus, such as a circuit board apparatus, wherein a semiconductor device is electrically connected to a circuit board without making metallurgical connections between the external terminals of the device and the conductive pads on the circuit board. In one embodiment of the present invention, a single unitary connector made of an inexpensive rigid material, preferably plastic, is used to compress the semiconductor device against a circuit board to provide the necessary electrical connections. The connector includes a cavity for receiving a semiconductor device, and for aligning the semiconductor device both within the connector and on the circuit board. The connector also includes a plurality of locking pins for insertion through corresponding openings within the circuit board. The dimensions and tolerances of the connector are designed such that upon press fitting the locking pins through the holes in the circuit board, the semiconductor device has sufficient pressure exerted upon it to make adequate electrical connection to the circuit board. In a preferred embodiment, an elastomeric material is used to facilitate the pressure contacts. A complimentary connector can be used to connect another semiconductor device on the opposing side of the circuit board. In such an embodiment, the connectors are designed to have complimentary locking mechanisms, for example one connector will have a male locking mechanism (e.g. locking pins), while the other connector will have a female locking mechanism (e.g. locking holes). Forming each of the connectors as a single piece part makes assembly of the circuit board apparatus simple, with minimal piece parts and manufacturing and material costs, while minimizing the impact on the final assembly height or profile.

These and other features and advantage of the present invention will be more clearly understood from the following detailed description taken in conjunction with FIGS. 1–5. It is important to point out that the illustrations are not necessary drawn to scale, and that there are likely to be other embodiments of the invention which are not specifically illustrated. Throughout the various figures, like reference numerals are sometimes used to designate identical or corresponding parts.

FIG. 1 illustrates in a perspective view an upper connector 10 and a lower connector 20. As shown in FIG. 1, lower connector 20 includes a cavity 22 for receiving a semiconductor device. Upper connector 10 has a similar cavity, but which is not visible from the view of FIG. 1. The manner in which these cavities hold a semiconductor device will be further explained in reference to FIG. 2. Upper connector 10 includes a plurality of locking pins 14 located at each of four corners of the connector. As illustrated, the pins are located within rounded bumpers formed at each of the corners, but such is not a requirement in practicing the present invention. While four locking pins are illustrated, as few as two pins can be used, without an upper limit on the number of pins. As will be discussed further, the locking pins help to secure the connector against a circuit board, and also help to provide alignment between the semiconductor device and the circuit board. One such pin can be sufficient if alignment of the device to the circuit board can be ensured. Lower connector 20 includes locking hole which are complementary both in shape and configuration to locking pins 14. Upon attachment to a circuit board, locking pins 14 will be inserted through locking holes 24, as later illustrated in reference to FIG. 2. Upper connector 10 and lower connector 20 also include openings 16 and 26, respectively. Openings 16 and 26 can serve a variety of purposes. For example, the openings can be provided to enable inspection of the semiconductor device once the device is connected to a circuit board by the connector. Additionally, the openings may be provided for receiving a heat sink to aid in thermal dissipation away from the semiconductor device. Furthermore, openings 16 and 26 may be provided to enable a vacuum tool to pick up a semiconductor device and a connector simultaneously. The size, number, and shape of such openings is not limited by the invention.

In a preferred embodiment, upper connector 10 and lower connector 20 are made of a rigid plastic which is either mold in the desired shape or is machined to the desired shape. Plastic is preferred for cost considerations, but other materials can be used as functional equivalents. Any material which is sufficiently rigid to maintain its shape before, during, and after connection of the connectors to each other, to the circuit board, or to other locking means is suitable. Factors to consider in choosing a connector material include cost, weight, and the material thickness needed for adequate rigidity.

Figure 2:
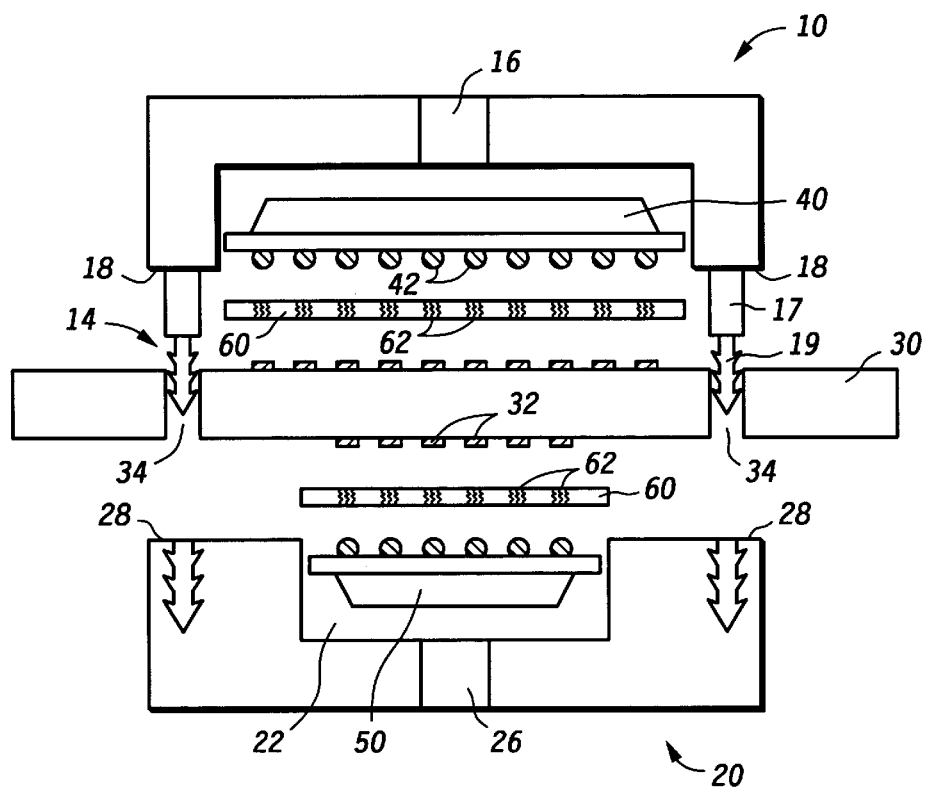
FIG. 2 is a cross-sectional view of the connectors of FIG. 1, taken along the lines 2—2 of FIG. 1, as the connectors are used to electrically connect two semiconductor devices to a circuit board in accordance with an embodiment of the present invention.

FIG. 2 illustrates connectors 10 and 20 as used to connect a semiconductor device 40 and a semiconductor device 50 to a circuitized substrate, and as viewed from a cross-sectional view taken along lines 2—2 of FIG. 1. In FIG. 2, upper connector 10 and lower connector 20 are aligned to circuitized substrate in the form of a circuit board 30, such as an organic printed circuit board. Semiconductor device 40 is aligned within a cavity 12 of upper connector 10. Likewise, semiconductor device 50 is aligned within cavity 22 of lower connector 20. In a preferred embodiment, the width and length dimensions of the cavity of each connector are designed to accommodate the maximum allowable size of the particular semiconductor device configuration, while simultaneously ensuring that the semiconductor device will be guaranteed to properly align to the circuit board. For example, semiconductor device 40 includes a plurality of external terminals, shown in FIG. 2 as a plurality of conductive balls 42. These conductive balls must properly align to a plurality of landing pads 32 on the circuit board. Cavity 12 within connector 10 is dimensioned such that any movement of the device within the cavity will still guarantee that conductive balls 42 align with the appropriate landing pads 32 of circuit board 30. Likewise, cavity 22 of lower connector 20 is dimensioned such that semiconductor device 50 is positioned within the cavity while still assuring that a plurality of conductive balls 52 of device 50 appropriately align with landing pads 32 on the other side of circuit board 30.

It is noted that cavity 12 of connector 10 and cavity 22 of connector 20 are of differing size. This is due to the fact that semiconductor devices 40 and 50 are of differing size, and perhaps shape. Accordingly, the type of semiconductor devices contained within cavities 12 and 22 can also be different. For instance, smaller cavity 22 might house a memory device while larger cavity 12 houses a microprocessor, digital signal process, embedded controller, gate array, or the like. Alternatively, cavities 12 and 22 can be of equal size and same shape to house the same type of semiconductor devices.

As also illustrated in FIG. 2, circuit board 30 includes alignment holes 34 for receiving locking pins 14 of upper connector 10. The number of alignment holes provided in the circuit board should correspond to the number of pins provided in the connector. In the particular embodiment illustrated in FIG. 2, locking pins 14 have two distinct portions, a straight portion 17 and a ridged portion 19. Both ridged portion 19 and straight portion 17 are dimensioned so as to fit through alignment holes 34 of circuit board 30. Additionally, ridged portion 19 is configured to press fit into locking holes 24 of lower connector 20. Upon pressing the upper and lower connectors together toward circuit board 30, ridged portions 19 of the locking pins fit into locking holes 24 of the lower connector. Due to the nature of the ridges, the connection of the upper and lower connectors together becomes permanent. In other words, the two connectors cannot be physically separated from one another without physical destruction of one or either of the connectors. The ridges provided on ridged portions 19 as shown in FIGS. 1–3 are sometimes referred to as "zip" ridges.

Figure 3:
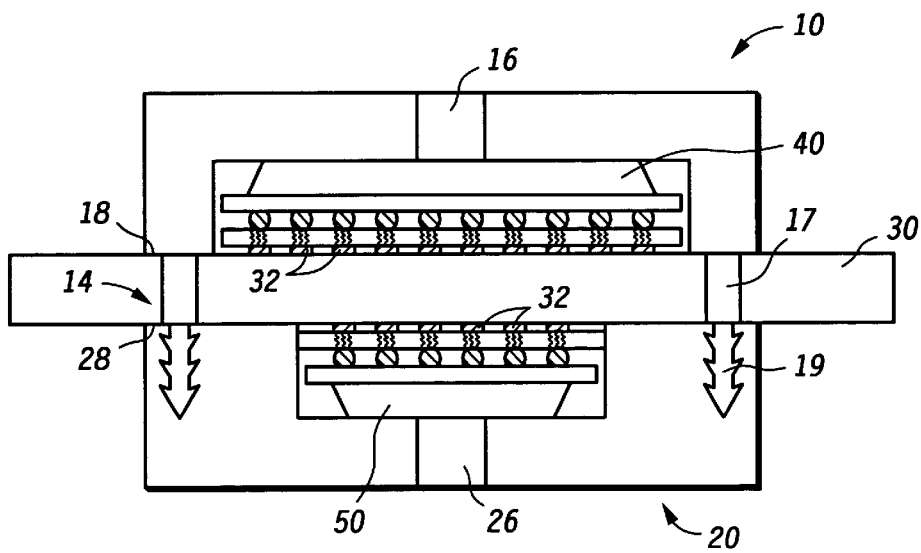
FIG. 3 is the circuit board assembly of FIG. 2 shown in cross-section after the upper and lower connectors are mated together and the electrical connection of the semiconductor devices to the circuit board is made.

FIG. 3 illustrates the manner in which upper connector 10 and lower connector 20 are connected to one another around circuit board 30. Once connected, straight portions 17 of the locking pins reside within alignment holes 34 of the circuit board. A shoulder 18 is formed where locking pins 14 are connected with the main body of connector 10. In the assembled configuration as shown in FIG. 3, shoulders 18 rest upon the surface of the circuit board 30. Accordingly, the shoulders define the depth or height of cavity 12. Similarly, connector 20 has shoulders 28.

In accordance with the present invention, upon connecting the upper and lower connectors together around the circuit board, semiconductor devices 40 and 50 are electrically connected to the landing pads of the circuit board. In a preferred embodiment, an interposer 60 is used to facilitate the electrical connection of the semiconductor devices to the board. Interposers 60 reside between each of the semiconductor devices and the circuit board, and therefore must provide electrical connection between the semiconductor devices and the circuit board. Such electrical connection can be achieved by using an interposer which is conductive in only the vertical or Z direction. Such interposers are known as Z-axis interposers. Z-axis interposers work by providing conductive filaments 62 at the appropriate places within the interposer to provide electrical conductivity in the Z or vertical axis while avoiding conductivity in the X and Y or horizontal axis due to the fact that the conductive filaments are separated by dielectric material. The bulk dielectric material of interposer 60 is preferably chosen to be an elastomer, such that interposer 60 is compressed and deforms upon connecting upper and lower connectors 10 and 20 together and around circuit board 30. An interposer is particularly useful in conjunction with ball grid array (BGA) devices, such as those shown in FIGS. 2–3, because without an interposer the contact area between conductive balls 42 and 52 and planar landing pads 32 can be too small to provide adequate conductivity for proper device operation. A compliant Z-axis conductive interposer increases the contact area between the external terminals of the device and the circuit board since the interposer can conform to the shape of the conductive balls.

As shown in FIG. 3, in the final form the semiconductor devices are in intimate contact with the upper and lower connectors. Likewise, the semiconductor devices are in intimate contact with the interposers, which in turn are in intimate contact with the appropriate surface of the circuit board.

Figure 4:
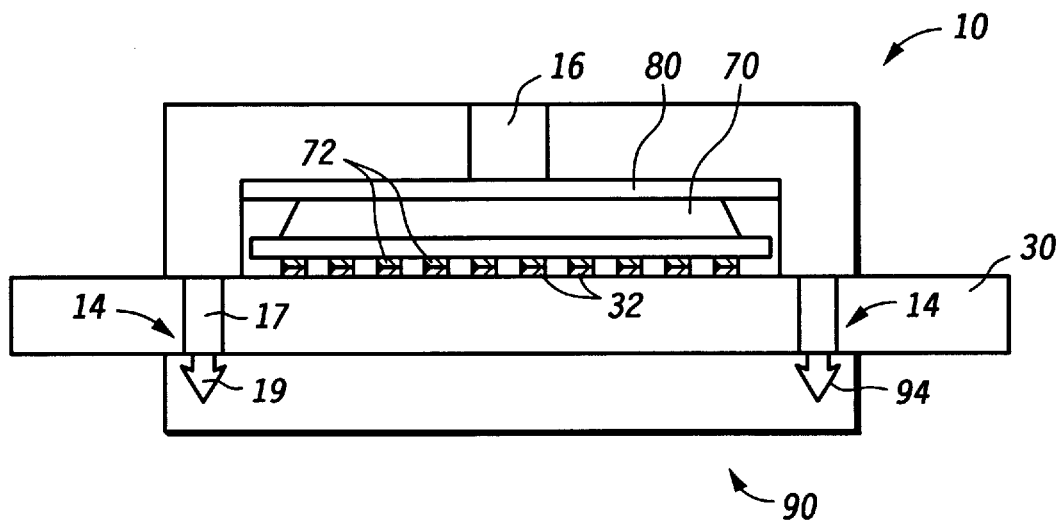
FIG. 4 is a cross-sectional view of an alternative embodiment of the present invention wherein an interposer separates the top of the semiconductor device from the upper connector, rather than having an interposer separating the semiconductor device and the circuit board.

FIG. 4 illustrates in a cross-sectional view an alternative embodiment of the present invention wherein an interposer is used not between the semiconductor device and the circuit board, but rather between the semiconductor device and the connector. As shown, a semiconductor device 70 is positioned immediately adjacent circuit board 30, such that the plurality of external terminals of device 70 are in physical and electrical contact with landing pads 32. In this embodiment, the external terminals of semiconductor device 70 are in the form of conductive pads rather than in the form of conductive balls. In other words, semiconductor device 70 is a land grid array (LGA) package rather than a ball grid array package. In using an LGA package configuration, conductive pads 72 of the device are formed of a material which is compatible with the material of landing pads 32 of circuit board 30. For example, both landing pads 32 and conductive pads 72 can be formed of gold, or copper or other metal which is plated with gold. In the embodiment illustrated in FIG. 4, an interposer 80 is positioned between semiconductor device 70 and upper connector 10. With such a position, there is no need for interposer 80 to provide any electrical connection between the device and the connector. Accordingly, interposer 80 may be formed of any elastomeric material, such that upon connecting upper connector 10 to circuit board 30, there is sufficient compliance in the interposer to establish sufficient pressure contact between conductive pad 72 and landing pads 32 without damage to either semiconductor device 70 or circuit board 30. In contrast to certain embodiments of the present invention which utilize a BGA device, a Z-axis conductive interposer is not needed between device 70 and circuit board 30 (although one could be used) because the contact area between landing pads 32 and conductive pads 72 is close to the full area of these conductive members.

FIG. 4 also illustrates a variation to the present invention wherein upper and lower connector are used without attaching or connecting a semiconductor device to each side of the circuit board. As shown in FIG. 4, upper connector 10 is connected to a lower connector 90, wherein lower connector 90 does not include a cavity for receiving a semiconductor device. Instead, lower connector 90 is simply provided as a plate-like member which includes locking holes 94 for receiving locking pins 14 of upper connector 10. It is also important to note that lower connector 90 need not be in the form of a full plate-like member. For instance, four individual smaller members could be attached to the four locking pins 14 (one for each pin), thereby saving material cost. However, a disadvantage in making a connecting member for each locking pin is the added piece parts and manufacturing costs associated with connecting a number of elements to the circuit board.

Figure 5:
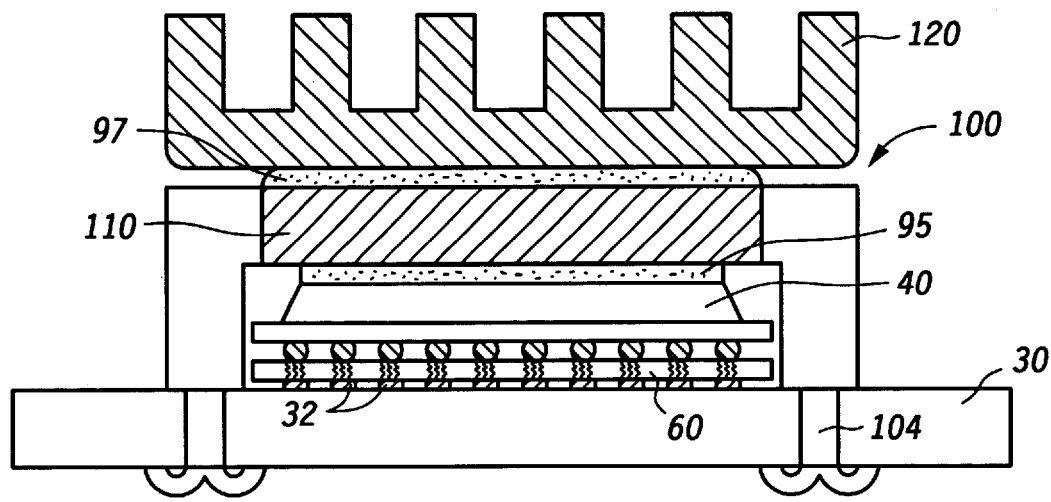
FIG. 5 illustrates in cross-section another embodiment of the present invention wherein a heat sink is integrated into the connector.

FIG. 5 illustrates in cross-sectional view yet another embodiment of the present invention wherein a connector 100 is used to connect semiconductor device 40 to circuit board 30, as previously described in reference to FIG. 1. However, a difference between connector 100 and upper connector 10 is the inclusion of an integrated heat conducting member 110 into connector 100. The addition of a heat conducting member 110 into connector 100 facilitates heat dissipation away from device 40. Preferably, a thermally conductive material, such as a thermal grease 95 or a thermally conductive adhesive is used between semiconductor device 40 and heat conducting member 110 to provide more efficient heat transfer across interfaces. Heat conducting member 110 is preferably formed of a material with high thermal dissipation, such as copper or other highly thermally conductive material. Heat conducting member 110 can be formed to be an integral part of connector 100 such that connector 100 remains a single unitary piece part for purposes of assembling circuit board 30. If heat conducting member 110 has insufficient surface area for semiconductor device 40, an additional heat sink 120 may be attached to the heat conducting member as shown in FIG. 5. Heat sink 120 can be designed using conventional fins for increased surface area as shown. Again, a thermally conductive material 97, preferably in the form of an adhesive, should be provided between heat conducting member 110 and heat sink 120 to secure the heat sink in please while providing efficient transfer of heat through interfaces in the conducting path away from semiconductor device 40. Rather than using two discrete heat dissipation elements, a finned heat sink could be formed to be an integral part of connector 100 to further minimize piece parts in the assembly process.

A benefit of providing a heat conductive member into a connector is that the present invention can be extended to use with a wider variety of semiconductor devices, including microprocessors which generate heat during operation. For example, the use of the present invention as illustrated within the embodiment of FIG. 5 would be useful for circuit board upgrades from one microprocessor to a next generation microprocessor. A circuit board manufacturer/assembler need not allocate a dedicated space for a microprocessor upgrade or remove a previously surface mounted microprocessor from the original board to upgrade. With the present invention, a microprocessor device can be attached to a circuit board without the surface mounting process, such that upon reaching the need of an upgraded microprocessor, the original connector can be dismantled, and an upgraded microprocessor can be attached to the same circuit board, requiring only a new connector.

FIG. 5 also demonstrates another manner in which a connector in accordance with the present invention can be connected to circuit board 30. As shown in the embodiment of FIG. 5, only one connector, a top side connector, is used. Connector 100 includes locking pins 104 which are inserted through similar alignment holes within circuit board 30. However, rather than locking pins 104 fitting into a corresponding locking hole of another connector member, locking pins 104 are splayed or mechanically deformed as shown in FIG. 5 such that the connector cannot readily be lifted or removed from circuit board 30. Splaying of the locking pins can be accomplished by providing a cut or slit through the locking pin, and after insertion through the holes in the circuit board mechanically deforming the two segments of the locking pin as illustrated. Alternatively, the locking pins could be thermally treated such that the end of the locking pin is softened and a mechanical operation deforms the plastic such that a head is created on the pin which is larger than the opening in the circuit board. Other similar types of locking mechanisms or securing components can be used in accordance with the present invention in embodiments having just one connector.

The foregoing description and illustrations contained herein demonstrate many of the advantages associated with the present invention. In particular, it has been revealed that use of a connector in accordance with the present invention can be used to electrically connect a semiconductor device to a circuit board without the need for forming mechanical metallurgical connections between the external terminals of the semiconductor device and the conductive pads on the circuit board. Moreover, it has been established that such a connector can be provided as a single unitary piece part made of an inexpensive plastic material. As a single unitary member, attachment of the connector to a circuit board is made easier and reduces the cost of assembly. Additionally, a connector as used in accordance with the present invention can be adapted for variety of assembly circumstances. For example, the connector can be adapted for attachment of semiconductor devices to both sides of a circuit board. A connector can also be adapted to include a heat conducting member to facilitate thermal dissipation of high power devices. Furthermore, the connector is suited for a variety of semiconductor device types, including memory and microprocessor devices. Yet another advantage is that the invention introduces minimal added height to final assembly.

Thus it is apparent that there has been provided, in accordance with the invention, an electronic apparatus, and more particularly a circuit board apparatus, that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to a particular type of semiconductor device. While memory devices and devices which are expandable or up-gradable are the most likely types of devices to benefit from the invention, devices of other functionality types can be used. Likewise, while BGA devices can more readily be used than peripherally leaded devices (such as gull-wing or J-shaped leads), the invention is not restricted to use only with BGA devices. As another example, while the present invention has been illustrated in reference to connecting packaged semiconductor devices to a circuit board, it is also apparent that the present invention can be used to attach bare die to a circuit board as well. In such an embodiment, semiconductor devices 40, 50, and 70 would be replaced by a flip-chip semiconductor die which is to be attached to the circuit board (e.g. using direct chip attachment, DCA, techniques). In a flip-chip configuration use of a Z axis conductive interposer between the semiconductor die and the circuit board is preferred. As another variation within the scope of the present invention, the packaged body of the semiconductor device could be over-molded such that locking pins and/or locking holes are an integral part of the package of the semiconductor device. In other words, during the molding operation to encapsulate the semiconductor die within the device, the locking pins and/or the locking holes would be formed in the molding process which encapsulates the semiconductor die to form the device package. In yet another embodiment, the semiconductor device could be aligned within a connector using the shoulders of the locking pins rather than by a cavity as shown in the figures. Different shaped shoulders could be used to aid alignment or prevent improper rotation of the device within the connector and on the circuit board. Therefore, it is intended that the present invention cover all such variations and modifications that fall within the scope of the appended claims.

What is claimed is:

1. An electronic apparatus comprising:
   a circuitized substrate having holes and pads;
   a semiconductor device having external terminals, wherein the external terminals are electrically connected to the pads of the circuitized substrate; and
   a connector having a single body that includes locking pins and a cavity, wherein:
      the semiconductor device lies between the circuitized substrate and the connector, in said cavity; and
      the locking pins extend at least partially through the holes of the circuitized substrate and permanently secure the connector to the circuitized substrate such that electrical connection between the semiconductor device and the circuitized substrate is maintained.

2. The electronic apparatus of claim 1, wherein:
   the connector includes shoulders;
   each of the locking pins is contiguous with the connector at one of the shoulders; and
   each of the shoulders contacts the circuitized substrate.

3. The electronic apparatus of claim 1, wherein the connector is a unitary piece comprising a rigid material.

4. The electronic apparatus of claim 1, wherein the locking pins have zip ridges.

5. The electronic apparatus of claim 1, further comprising a securing component, wherein the securing component lies on an opposite side of the circuitized substrate and secures the connector to the circuitized substrate.

6. The electronic apparatus of claim 1, wherein each of the locking pins is a deformed locking pin that secures the connector to the circuitized substrate.

7. The electronic apparatus of claim 1, further comprising an interposer lying between the semiconductor device and the circuitized substrate, wherein the interposer includes conductors that electrically connect the external terminals of the semiconductor device with the pads of the circuitized substrate.

8. The electronic apparatus of claim 1, wherein the connector has a hole extending therethrough.

9. The electronic apparatus of claim 1, wherein electrical connection of the external terminals to the pads of the circuitized substrate is maintained without metallurgical bonds therebetween.

10. The electronic apparatus of claim 2, wherein at least two of the shoulders have different shapes.

11. An electronic apparatus comprising:
   a circuitized substrate having holes and pads;
   a semiconductor device having external terminals, wherein the external terminals are electrical connected to the pads of the circuitized substrate;
   an interposer lying between the semiconductor device and the connector, wherein the interposer is compressible; and a connector having a single body that includes locking pins, wherein:
the semiconductor device lies between the circuitized substrate and the connector; and
the locking pins extend at least partially through the holes of the circuitized substrate and permanently secure the connector to the circuitized substrate such that electrical connection between the semiconductor device and the circuitized substrate is maintained.

12. The electronic apparatus of claim 11, wherein the pads and the external terminals comprise gold.

13. An electronic apparatus comprising:
a circuitized substrate having:
a first plurality of pads on a first side of the circuitized substrate; and
a second plurality of pads on a second side of the circuitized substrate, wherein the second side lies on an opposite side of the circuitized substrate;
a first semiconductor device having a first plurality of external terminals, wherein each terminal of the first plurality of external terminals is electrically connected to a pad of the first plurality of pads;
a second semiconductor device having a second plurality of external terminals, wherein each terminal of the second plurality of external terminals is electrically connected to a pad of the second plurality of pads;
a first connector having locking pins, wherein the first semiconductor device lies between the first side of the circuitized substrate and the first connector; and
a second connector having locking holes, wherein:
the second semiconductor device lies between the second side of the circuitized substrate and the second connector; and
each of the locking pins of the first connector extends into one of the locking holes of the second connector and permanently secures the first and second connectors to the circuitized substrate.

14. The electronic apparatus of claim 13, wherein the first and second semiconductor devices are memory devices.

15. The electronic apparatus of claim 13, where the locking pins have first locking features, and the locking holes have second locking features that are complementary to the first locking features.

16. The electronic apparatus of claim 13, wherein:
the first connector has a first cavity;
the first semiconductor device lies at least partially within the first cavity;
the second connector has a second cavity that has a different size compared to the first cavity; and
the second semiconductor device lies at least partially within the second cavity.

17. The electronic apparatus of claim 13, wherein each of the first and second connectors is a unitary piece part comprised of a rigid material.

18. The electronic apparatus of claim 13, further comprising a first interposer and a second interposer, wherein:
the first interposer lies between the first semiconductor device and the circuitized substrate; and
the second interposer lies between the second semiconductor device and the circuitized substrate.

19. The electronic apparatus of claim 13, further comprising a first interposer and a second interposer, wherein:
the first and second interposers are compressible;
the first interposer lies between the first semiconductor device and the first connector; and
the second interposer lies between the second semiconductor device and the second connector.

20. The electronic apparatus of claim 15, wherein the first locking features are zip ridges.

* * * * *